United States Patent
Ishikawa

(10) Patent No.: US 8,803,308 B2
(45) Date of Patent: Aug. 12, 2014

(54) SEMICONDUCTOR DEVICE HAVING CHIP CRACK DETECTION STRUCTURE

(71) Applicant: Toru Ishikawa, Tokyo (JP)

(72) Inventor: Toru Ishikawa, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/137,857

(22) Filed: Dec. 20, 2013

(65) Prior Publication Data

US 2014/0151702 A1     Jun. 5, 2014

Related U.S. Application Data

(63) Continuation of application No. 13/461,627, filed on May 1, 2012, now Pat. No. 8,624,401.

(30) Foreign Application Priority Data

May 18, 2011   (JP) ................................. 2011-111673

(51) Int. Cl.
*H01L 23/495*     (2006.01)

(52) U.S. Cl.
USPC ............................. 257/686; 257/48; 257/777

(58) Field of Classification Search
USPC ............ 257/48, 686, 777, 774, 723, 724, 773
See application file for complete search history.

(56) References Cited

U.S. PATENT DOCUMENTS

| | | | | |
|---|---|---|---|---|
| 8,242,589 B2* | 8/2012 | Saen et al. | ...................... | 257/686 |
| 8,653,645 B2* | 2/2014 | Yamaoka et al. | ............. | 257/691 |
| 2002/0153899 A1 | 10/2002 | Watanabe et al. | | |
| 2009/0057925 A1 | 3/2009 | Sasaki | | |
| 2010/0258932 A1 | 10/2010 | Yoshida et al. | | |
| 2012/0049884 A1 | 3/2012 | Kaltalioglu | | |
| 2012/0153450 A1* | 6/2012 | Kim | ............................... | 257/686 |
| 2013/0134584 A1 | 5/2013 | Wada | | |
| 2013/0161827 A1 | 6/2013 | Nakazawa et al. | | |
| 2013/0162282 A1* | 6/2013 | Hatakeyama et al. | ... | 324/762.01 |
| 2014/0028339 A1* | 1/2014 | Lee | .......................... | 324/755.05 |
| 2014/0078843 A1* | 3/2014 | Nishioka | ....................... | 365/201 |

FOREIGN PATENT DOCUMENTS

| | | |
|---|---|---|
| JP | 6-244254 A | 9/1994 |
| JP | 2009-054862 A | 3/2009 |

* cited by examiner

*Primary Examiner* — Sheila V. Clark
(74) *Attorney, Agent, or Firm* — McGinn IP Law Group, PLLC

(57) ABSTRACT

A semiconductor device includes a plurality of signal terminals on each of a plurality of vertically stacked semiconductor chips, each plurality of signal terminals connected to vertically aligned signal terminals of an adjacent semiconductor chip by through silicon vias, a common test terminal on each of the plurality of vertically stacked semiconductor chips connected to a vertically aligned common test terminal of an adjacent semiconductor chip by a through silicon via; a plurality of spiral test terminals on the plurality of vertically stacked semiconductor chips, each spiral test terminal connected to a non-vertically aligned spiral test terminal of an adjacent semiconductor chip by a through silicon via, and a conductive line arranged along a periphery of at least one of the plurality of vertically stacked semiconductor chips, the conductive line connected to a respective common test terminal and a respective spiral test terminal.

5 Claims, 18 Drawing Sheets

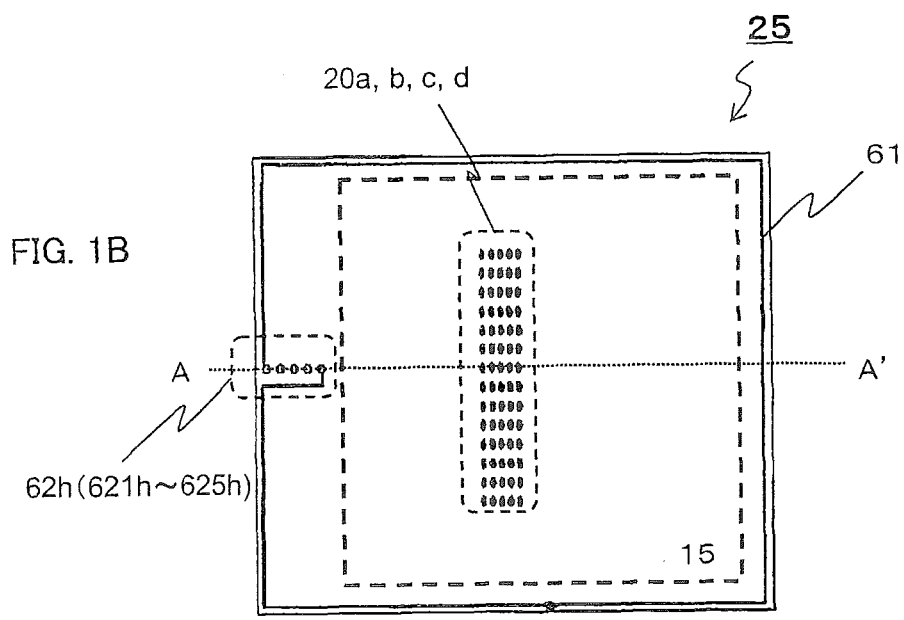

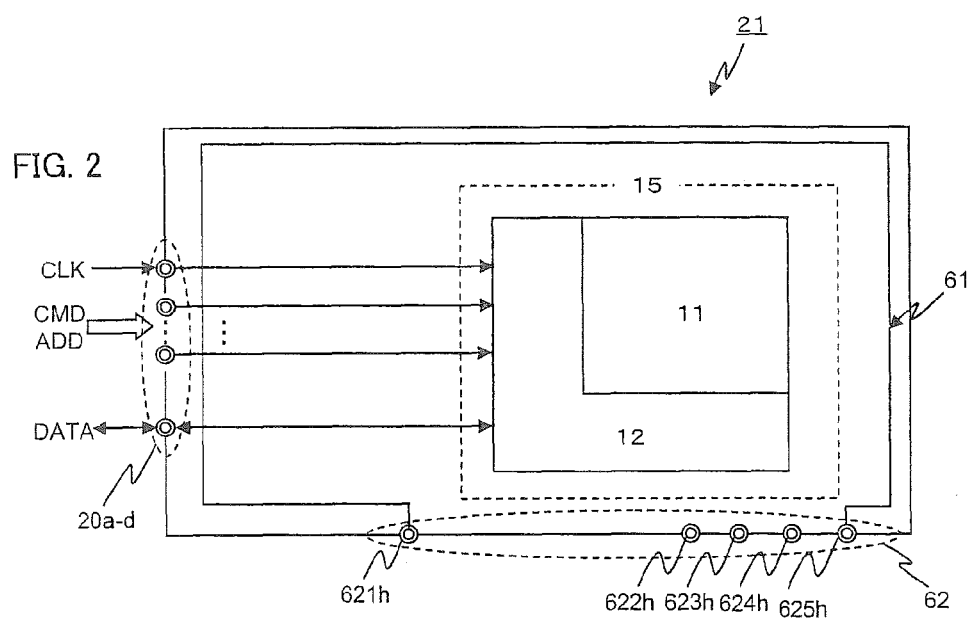

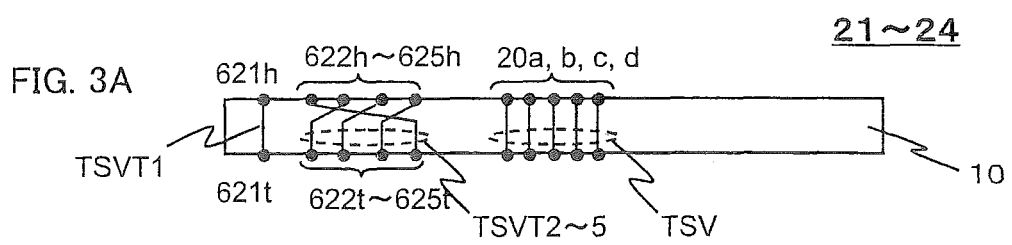

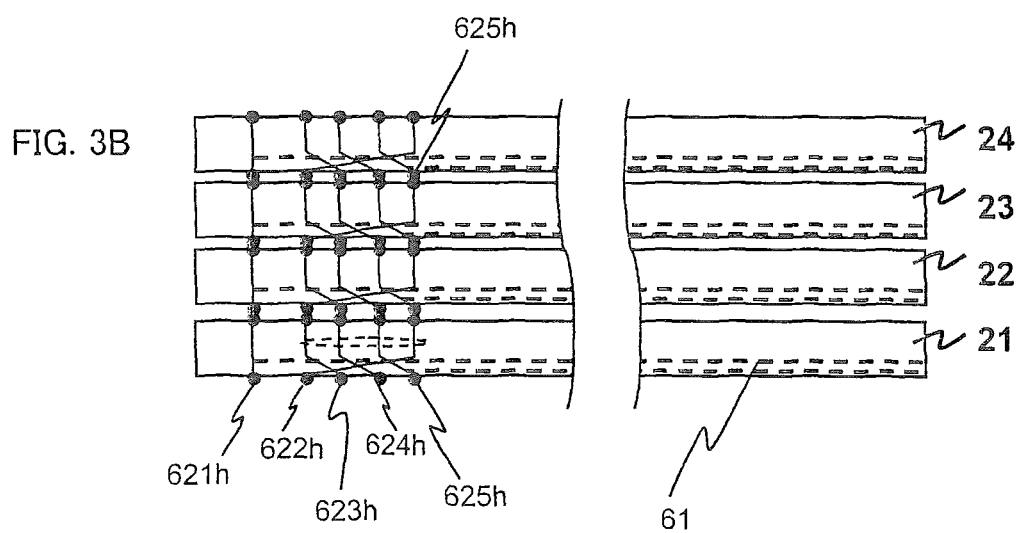

View from Arrow Side in FIG. 5

SEMICONDUCTOR DEVICE HAVING CHIP CRACK DETECTION STRUCTURE

The present application is a Continuation Application of U.S. patent application Ser. No. 13/461,627 filed on May 1, 2012, which is based on and claims priority from Japanese Patent Application No. 2011-111673, filed on May 18, 2011, the entire contents of which are incorporated herein by reference.

BACKGROUND OF THE INVENTION

1. Field of the Invention

The present disclosure relates to a semiconductor device having a detection test structure for a crack of a semiconductor chip (or chip crack detection structure).

2. Description of Related Art

In manufacture of a semiconductor device, a stress or the like on cutting, mounting or heating sometimes causes a crack in a semiconductor chip. As a method of detecting such a crack, there is an example using a structure disclosed by Japanese Patent Kokai Publication No. H06-244254 (Patent Document 1), for example. This detects existence of the crack by measuring resistance of an electric conductor provided in a periphery of the semiconductor chip.

Japanese Patent Kokai Publication No. 2009-54862A, which corresponds to US2009/057925A1 (Patent Document 2) discloses an art of detecting whether or not there is a crack in a semiconductor chip by providing a wiring and a plurality of electrode pads for detecting the crack along an entire periphery of the semiconductor chip and detecting change of resistance between the electrode pads which are selected among the plurality of the electrode pads and connected to both ends of the wiring.

The above Patent Documents are incorporated herein by reference thereto in their entirety. The inventor has realized that in the detection methods disclosed in Patent Documents 1 and 2, no consideration is given to a detection of a crack of each semiconductor chip in a semiconductor device of a stack type in which a plurality of the semiconductor chips are stacked. If a plurality of the semiconductor chips disclosed in Patent Document 2 are stacked, in the semiconductor device of the stack type, the pads for detecting a crack are connected in common. Therefore, even though the occurrence of a crack in any semiconductor chip of the semiconductor device of the stack type can be confirmed, there is a problem that the semiconductor chip having the crack can not be identified.

The inventor has realized that if the structure disclosed in Patent Document 1 is used for the semiconductor device of the stack type, even though semiconductor chips having an electric conductor 70 for crack detection shown in FIG. 12B are stacked, the crack in the most exterior semiconductor chip (Slice 0) shown in FIG. 12A may be detected, but the crack in interior semiconductor chips can not be detected.

SUMMARY

In an aspect of this disclosure, there is provided a semiconductor device comprising a plurality of signal terminals on each of a plurality of vertically stacked semiconductor chips, each plurality of signal terminals connected to vertically aligned signal terminals of an adjacent semiconductor chip by through silicon vias; a common test terminal on each of the plurality of vertically stacked semiconductor chips connected to a vertically aligned common test terminal of an adjacent semiconductor chip by a through silicon via; a plurality of spiral test terminals on the plurality of vertically stacked semiconductor chips, each spiral test terminal connected to a non-vertically aligned spiral test terminal of an adjacent semiconductor chip by a through silicon via; and a conductive line arranged along a periphery of at least one of the plurality of vertically stacked semiconductor chips, the conductive line connected to a respective common test terminal and a respective spiral test terminal.

Another aspect of the disclosure provides such a device that comprises a first semiconductor chip and a second semiconductor chip stacked with the first semiconductor chip. The first semiconductor chip comprises: a first semiconductor substrate including first and second main surfaces opposite to each other, a first penetration electrode penetrating through the first semiconductor substrate, a plurality of second penetration electrodes each penetrating through the first semiconductor substrate, a first terminal formed on a side of the first main surface of the first semiconductor substrate, the first terminal being vertically aligned with and electrically connected to the first penetration electrode, a plurality of second terminals formed on a side of the first main surface of the first semiconductor substrate, each of the second terminals being vertically aligned with an associated one of the second penetration electrodes and electrically connected to another one of the second penetration electrodes that is not vertically aligned with the associated one of the second penetration electrodes, a third terminal formed on a side of the second main surface of the first semiconductor substrate, the third terminal being vertically aligned with and electrically connected to the first penetration electrode, a plurality of fourth terminals formed on a side of the second main surface of the first semiconductor substrate, each of the fourth terminals being vertically aligned with and electrically connected to an associated one of the second penetration electrodes, and a first conductive line formed on a side of the first main surface of the first semiconductor substrate, the first conductive line including a first end portion electrically connected to the first terminal and a second end portion electrically connected to one of the second terminals. On the other hand, the second semiconductor chip that is stacked with the first semiconductor chip and comprises a second semiconductor substrate including third and fourth main surfaces opposite to each other, a fifth terminal formed on a side of the third main surface of the second semiconductor substrate, the fifth terminal being electrically connected to the third terminal of the first semiconductor chip, a plurality of sixth terminals formed on a side of the third main surface of the second semiconductor substrate, each of the sixth terminals being electrically connected to an associated one of the fourth terminals of the first semiconductor chip, and a second conductive line formed on a side of the third main surface of the second semiconductor substrate, the second conductive line including a third end portion electrically connected to the fifth terminal and a fourth end portion electrically connected to one of the sixth terminals.

BRIEF DESCRIPTION OF THE DRAWINGS

FIGS. 1A-1B are the cross-sectional view and plan view of a semiconductor device that has a stack of semiconductor chips having a crack test structure of Example 1 of the present disclosure;

FIG. 2 is a block diagram of a circuit of the semiconductor device according to Example 1 of the present disclosure;

FIGS. 3A-3B are detailed cross-sectional views of the semiconductor device of the stack type according to Example 1;

PREFERRED EXAMPLES

Example 1

The disclosure will be now described herein with reference to illustrative exemplary embodiments. Those skilled in the art will recognize that many alternative exemplary embodiments can be accomplished using the teachings of the present disclosure and that the disclosure is not limited to the exemplary embodiments illustrated for explanatory purposes.

Figure 1A:
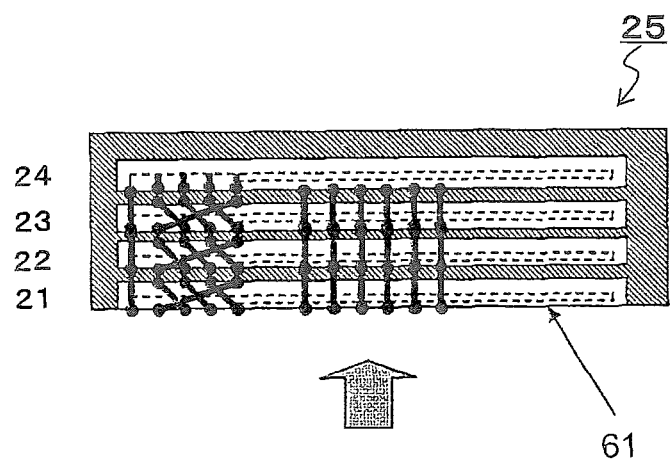

FIGS. 1A-1B are the cross-sectional view and a plan view of a semiconductor device 25 in which four semiconductor chips are stacked in layers, the semiconductor chip having a crack test structure according to Example 1 of the present disclosure. FIG. 1B is the plan view in a direction of an arrow of FIG. 1A, and FIG. 1A is the cross-sectional view along an A-A' line of FIG. 1B. In this Example, first, a chip stack of memory devices (semiconductor chips) 21-24 is formed, and secondly mounted on a memory controller (not illustrated) and an interposer (not illustrated) to manufacture the semiconductor device of the stack type. The present disclosure can be also applied to a chip stack including not only the stack of the memory device, but also any device (a logic element and the like) other than the memory device.

FIG. 2 is a circuit block diagram of Example 1 illustrating in FIGS. 1A-1B. An internal circuit 15 includes a memory cell array 11 having memory cells, a read/write-controlling circuit 12 and the like. The read/write-controlling circuit 12 is a circuit to control an operation of writing data to the memory cell array 11 and an operation of reading data from the memory cell array 11. Each circuit included in the internal circuit 15 is connected to a corresponding terminal among a plurality of signal terminals 20a, 20b, 20c and 20d. Each of the signal terminals 20a, 20b, 20c and 20d is connected to a corresponding one of through-silicon vias TSVs that are provided as penetration electrodes penetrating through a semiconductor (silicon) substrate, and each circuit in the internal circuit 15 sends/receives a signal to/from a memory controller through the corresponding through-silicon via TSV.

The signal terminals 20a-20d include a clock terminal, command terminal, address terminal and data terminal. The clock terminal receives a clock signal CLK supplied from an external, the command terminal receives a command signal CMD from the external, and the address terminal receives an address signal ADD supplied from the external. The data terminal receives data DATA supplied from the read/write-controlling circuit 12 and outputs the data to the external during the reading operation, and receives the data DATA supplied from the external and sends the data to the read/write-controlling circuit 12 during the writing operation. The read/write-controlling circuit 12 controls the reading operation and writing operation of the memory cell array 11 according to the clock signal CLK, command signal CMD and address signal ADD.

Although FIG. 2 illustrates a (front side) first test terminal 621h and (front side) second test terminals 622h-625h disposed along a periphery of the semiconductor chip 21, this is illustrated for the purpose of clearly indicating the electrical connection of the semiconductor chip 21. The (front side) first test terminal 621h and (front side) second test terminals 622h-625h are preferably disposed as illustrated in FIG. 1B so that a part of a conductive line 61 for the crack check which is disposed along the periphery is made longer.

As illustrated in FIG. 1B, on the front side of the semiconductor chip (e.g., memory device) 21 including the internal circuit 15, the conductive line 61 for the crack check is provided on the semiconductor chip along the periphery of the semiconductor chip. When the conductive line 61 is broken by causing a crack in the semiconductor chip, for example, the resistance of the conductive line increases unusually. The increase of the resistance of the conductive line 61 may be measured through the test terminals 62.

One end of the conductive line 61 is connected to the test terminal 621h (first test terminal), and the other end is connected to the test terminal 625h (one of second test terminals). The connection relation may be same as in any of the semiconductor chips 21-24. Namely, it is unnecessary to manufacture the semiconductor chips 21-24 as a plurality of the memory chips having different connections of the conductive line 61 and the front side test terminals from one another.

As shown in FIG. 1B, in the semiconductor chip 21, five (front side) test terminals 62h (621h-625h) for the crack test are formed in order from the left side of the figure. On the opposite surface (back side), five (back side) test terminals 62t (621t-625t) (see further FIGS. 3A-3B) for the crack test are also formed corresponding to the (front side) test terminals 62h (621h-625h), that is, at opposite positions through a substrate. Among them, the front side test terminal 621h and back side test terminal 621t are also referred to as the first test terminals (the terminals connected making a pair), the front side test terminals 622h-625h and back side test terminals 622t-625t are also referred to as the second test terminals (the terminals being disposed at positions opposing one another to form a pair, but not connected so as to form a pair).

The front side test terminal 621h and back side test terminal 621t, which are a pair of the first test terminals, are electrically connected to each other with a through-silicon via TSVT1 for the test. On the other hand, the front side test terminal 622h, which is one of the second test terminals, is connected not to the back side test terminal 622t disposed at a position opposite to itself, but to the back side test terminal 625t with a through-silicon via TSVT2. The front side test terminal 623h is connected to the back side test terminal 622t, the front side test terminal 624h is connected to the back side test terminal 623t, and the front side test terminal 625h is connected to the back side test terminal 624t, with corresponding through-silicon vias TSVT3-5, respectively. That is, each front side test terminal is connected to the back side terminal disposed at a position corresponding to the next terminal. As described below, this formulation is intended for making a connection mode of the through-silicon vias TSVT2-5 of the memory devices in a spiral manner (so that a relative horizontal position is changed when going upward, namely, to the next stage (layer) of the stack) when the memory devices 21-24 are stacked.

FIGS. 3A-3B show a detailed cross-sectional view of the semiconductor device of the stack type in FIGS. 1A-1B, FIG. 3A is a cross-sectional view of one semiconductor chip (which is in common to 21-24), and FIG. 3B is a cross-sectional view of the semiconductor device in which four semiconductor chips 21-24 illustrated in FIG. 3A are stacked. For convenience, FIG. 3B is illustrated upside down as compared with FIG. 3A. That is, FIG. 3B illustrates the example in which the semiconductor chips are stacked facing downward, and, however, the present disclosure may be applied to a device in which the semiconductor chips are stacked facing upward. A substrate 10 of the semiconductor chip has a semiconductor substrate and a device layer including a multi-layered structure.

The conductive line 61 is illustrated by broken lines in FIG. 3B in order to schematically indicate the electrical connections although the conductive line 61 is actually provided along the periphery (see FIG. 1B) of the surface of the memory chip and therefore does not appear in the cross-sectional view.

The front side test terminals 621h of the semiconductor chips 21-24 are connected in common through the back side test terminals 621t of the chips in the next stage (on the down side). The front side test terminal of the lowest semiconductor chip 21 in the figure is open because there is no chip in the next stage.

The front side test terminals 622h-625h of the semiconductor chips 21-24 are connected through the through-silicon vias TSVT2-5, shifting the terminal to the next. Giving an example concretely, the front side test terminal 625h of the top semiconductor chip 24 in the figure is electrically connected to the front side test terminal 624h of the semiconductor chip 21 through the back side test terminal 625t of the semiconductor chip 23, front side test terminal 622h of the semiconductor chip 23, the back side test terminal 622t of the semiconductor chip 22, the front side test terminal 623h of the semiconductor chip 22 and the back side test terminal 623t of the semiconductor chip 21. In a similar way, the front side test terminal 625h of the semiconductor chip 23 is electrically connected to the front side test terminal 623h of the semiconductor chip 21, and the front side test terminal 625h of the semiconductor chip 22 is electrically connected to the front side test terminal 622h of the semiconductor chip 21.

Referring to the above structure focusing on the electrical connection relation of the conductive lines 61, one ends of the conductive lines 61 of the semiconductor chips 21-24 (the ends on a side connected to the front side test terminal 621h) are connected to the front side test terminal 621h of the semiconductor chip 21 in common. On the other hand, the other ends (the ends on a side connected to the front side test terminal 625h) are connected to the corresponding one of the front side test terminals 622h-625h of the semiconductor chip 21, respectively. Concretely, the other end of the conductive line 61 of the semiconductor chip 21 is electrically connected to the front side test terminal 625h of the semiconductor chip 21, the other end of the conductive line 61 of the semiconductor chip 22 is electrically connected to the front side test terminal 622h of the semiconductor chip 21, the other end of the conductive line 61 of the semiconductor chip 23 is electrically connected to the front side test terminal 623h of the semiconductor chip 21, and the other end of the conductive line 61 of the semiconductor chip 24 is electrically connected to the front side test terminal 624h of the semiconductor chip 21.

According to the above structure, by measuring the resistance between the front side test terminal 621h of the semiconductor chip 21 and any one of the front side test terminals 622h-625h of the semiconductor chip 21, the existence of a crack in each of the semiconductor chips 21-24 can be checked even in the stacking state, that is, when there is a crack in the memory chip of any semiconductor chip in the stacking state, it can be identified which chip has the crack.

Figure 4A:
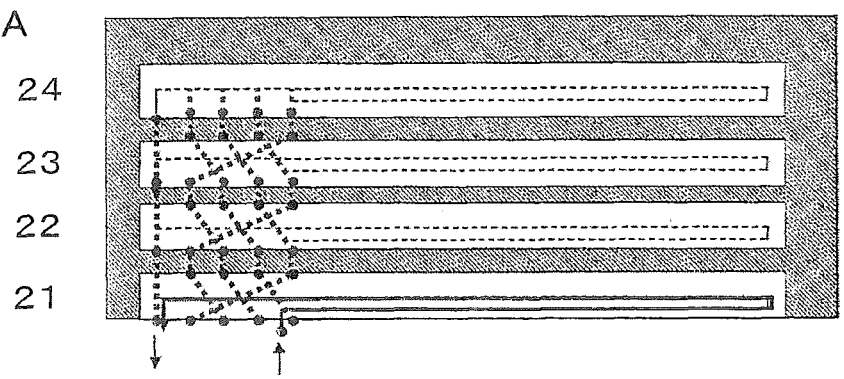
FIGS. 4A-4B show a method of checking a crack of the semiconductor chip on each layer in the semiconductor device illustrated in Example 1.
Figure 4B:
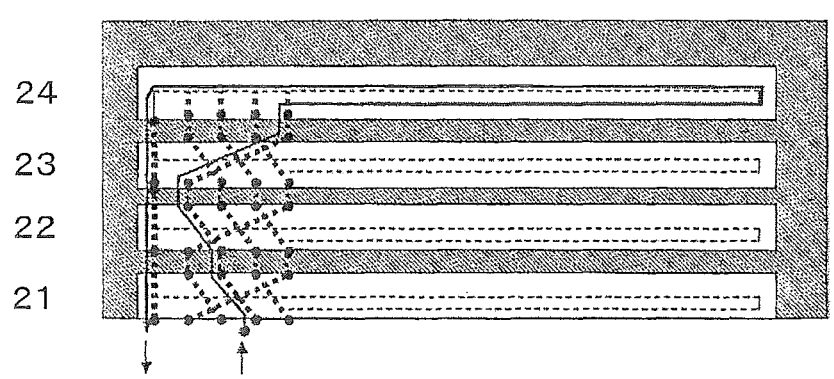

FIGS. 4A-4B illustrate a method of checking a crack of each semiconductor chip in the semiconductor device illustrated in FIGS. 1A-1B. FIG. 4A illustrates the crack check of the semiconductor chip 21, and FIG. 4B illustrates the crack check of the semiconductor chip 24. When the semiconductor chip 21 is checked for a crack, the resistance between the test terminal 621 and the test terminal 625 may be measured, and when the semiconductor chip 24 is checked for a crack, the resistance between the test terminal 621 and the test terminal 624 may be measured. In this way, even after stacked, each semiconductor chip can be individually checked for a crack.

In this Example, because each of the group of the front side test terminals (621h-625h) and the group of the back side test terminals (621t-625t) located in the positions opposite to the front side test terminals is arrayed along a straight line (linearly), namely in a row, the front side test terminal 622h has no test terminal at a next position on the opposite surface (back side) and therefore is connected to the back side test terminal 625t which is located at the other end on the opposite surface. However, these test terminals may be disposed in a ring-shaped manner, for example (not illustrated). In this case, each of the test terminals on the both surfaces can be connected to test terminal on the opposite surface, shifting to the next (one by one). When such semiconductor chips are stacked as illustrated above, the through-silicon vias TSVT2-5 of the semiconductor chips are connected in a spiral manner as a whole.

Although any one test terminal is regularly connected to the next test terminal on the opposite surface in this Example, the effect of the present disclosure may be also obtain even if the test terminal is regularly connected to a terminal positioned, by one or more test terminals away, on the opposite surface. However, because there is a disadvantage such that the structure becomes complex, it is preferred that the test terminal is connected to the test terminal disposed at a position next to the opposite terminal, which is simplest.

Figure 5:
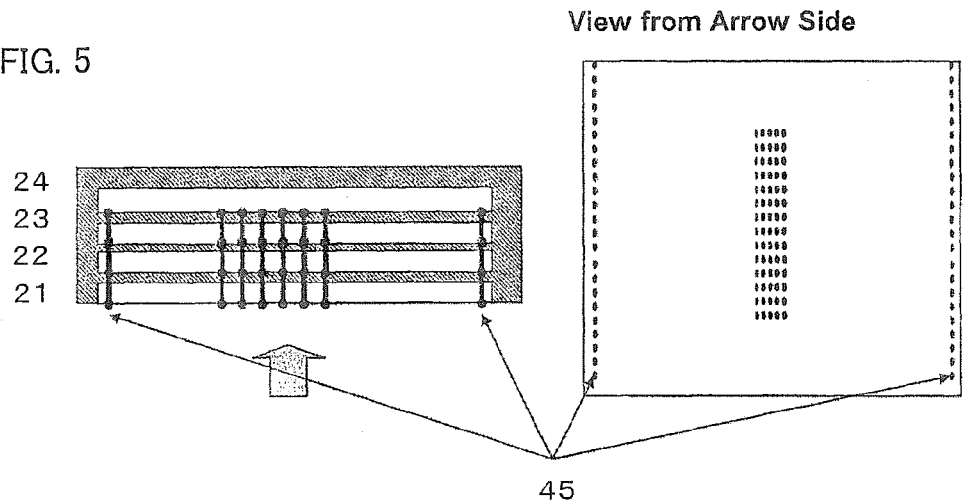
FIG. 5 shows a modified example of the semiconductor device of the present disclosure.

FIG. 5 illustrates a modified example of a semiconductor device according to the present disclosure. As illustrated in FIG. 5, there is a semiconductor device having support bumps 45 for mounting. The support bumps 45 for mounting are assigned to the first terminals for the crack check. The center bumps are often difficult to be used for the test because of determined ball assign. On the other hand, there is an advantage that a support ball(s) may be used as the test terminal for the crack check because it is not necessary to guarantee electric characteristics of the support ball.

Figure 6:
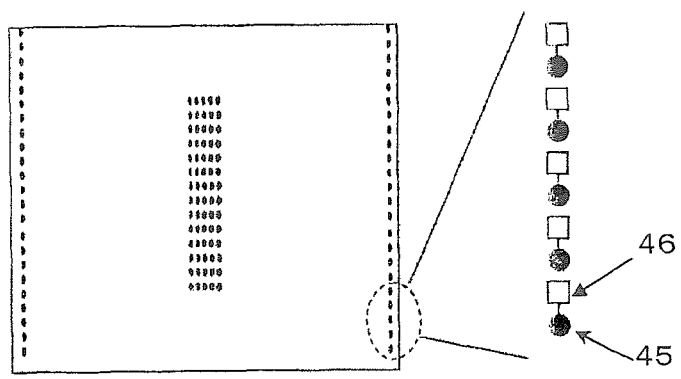
FIG. 6 shows a further modified example of the example illustrated in FIG. 5.

FIG. 6 illustrates a further modified example from the example illustrated in FIG. 5. As illustrated in FIG. 6, a pad 46 is provided between support bumps 45 for the mounting and connected to the support bump to put the semiconductor device to the test from the pad 46. When contact with the support bump 45 is difficult, and when the contact with support bump 45 has influence on the mounting, the contact with the support bump 45 is impossible for the test. In this case, it is possible to check a crack by contacting with the pad 46.

Example 2

Figure 7:
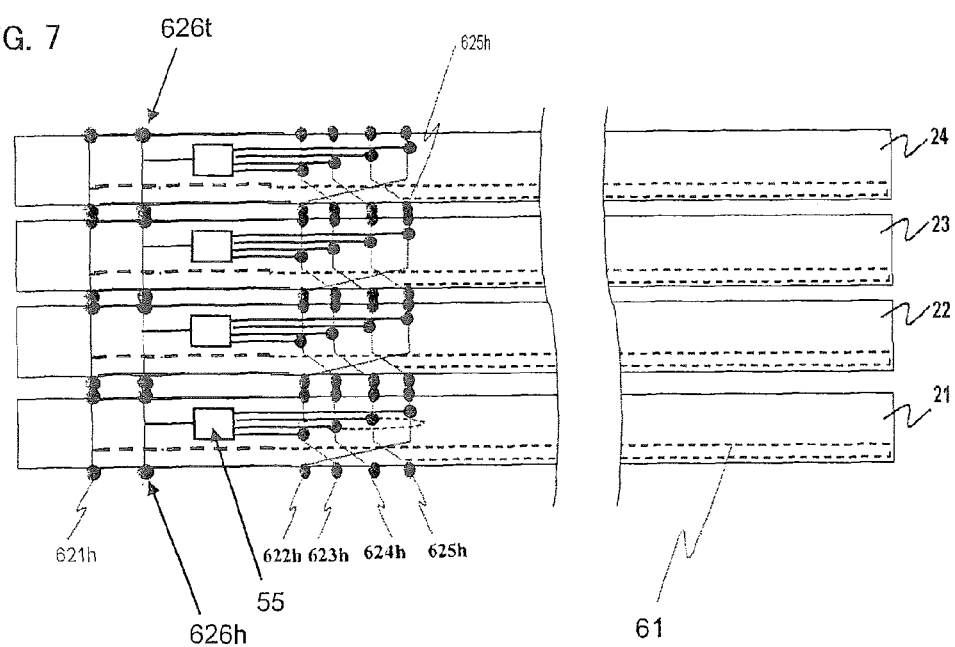
FIG. 7 is a cross-sectional view of a semiconductor device according to Example 2 of the present disclosure.

FIG. 7 is a cross-sectional view of a semiconductor device according to Example 2 of the present disclosure. A selector 55 and third test terminals 626h and 626t (front and back) that are connected by a through-silicon via (TSV) through the semiconductor chip are provided in each of the semiconductor chips (memory devices) 21-24, and the selector 55 switches an output among a plurality of input signals corresponding to an output signal from a mode resister 47 (see FIG. 8) of each semiconductor chip having the selector itself. That is, it is possible to perform output of the selector 55 by changing setting of the mode resister 47 with a mode register set command.

Figure 8:
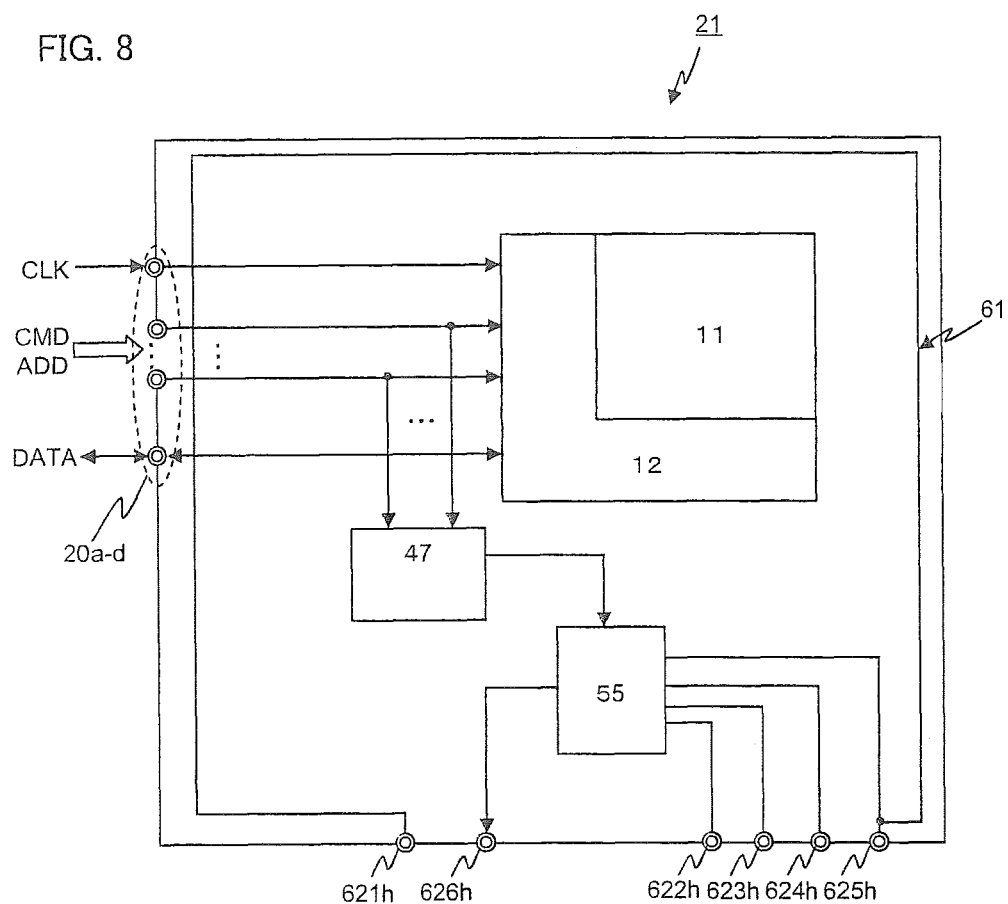
FIG. 8 is a block diagram of a circuit in the semiconductor device according to Example 2 of the present disclosure.

FIG. 8 is a circuit block diagram of the semiconductor device according to Example 2. Signal terminals 20a-20d include a clock terminal, command terminal, address terminal and data terminal. The clock terminal receives a clock signal CLK supplied from the external, the command terminal receives a command signal CMD from the external, and the address terminal receives an address signal ADD supplied from the external. The data terminal receives data DATA supplied from the read/write-controlling circuit 12 and outputs the data to the external during the reading operation, and receives the data DATA supplied from the external and sends the data to the read/write-controlling circuit 12 during the writing operation. The read/write-controlling circuit 12 controls reading operation and writing operation of the memory cell array 11 according to the clock signal CLK, command signal CMD and address signal ADD.

Although FIG. 8 illustrates a (front side) first test terminal 621h and (front side) second test terminals 622h-625h disposed along a periphery of the semiconductor chip 21, this is illustrated for the purpose of clearly indicating the electrical connection of the semiconductor chip 21. The (front side) first test terminal 621h and (front side) second test terminals 622h-625h are preferably disposed as illustrated in FIG. 1B so that a part of a conductive line 61 for the crack check which is disposed along the periphery is made longer.

The test output controlling circuit 47 is a mode register, for example, and forms a test output controlling signal, which switches over the output of the selector 55, corresponding to the command signal CMD and address signal ADD and supplies it to the selector 55. The selector 55 electrically connects any one of the (front side) second test terminals 622h-625h with a (front side) third test terminal 626h corresponding to the test output controlling signal.

In a memory system in which the memory devices 21-24 and memory controller are stacked, the test terminal 621h of FIG. 7 may be used as a ground terminal, and the third test terminal 626h of FIG. 7 may be connected to one of terminals (622h-625h) that are used for ordinary operation through the selector 55. According to this structure, the memory system can detect a crack of each semiconductor chip without increasing an external terminal (SB). That is, a crack of each semiconductor chip can be detected by a leakage current between the test terminals 626h and 621h.

Example 3

Figure 9A:
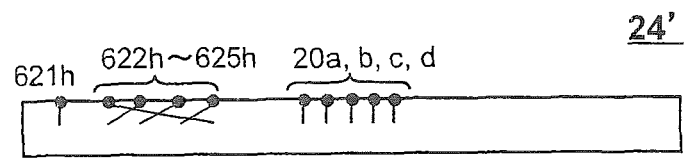
FIGS. 9A-9C are cross-sectional views illustrating Example 3 of the present disclosure.
Figure 9B:
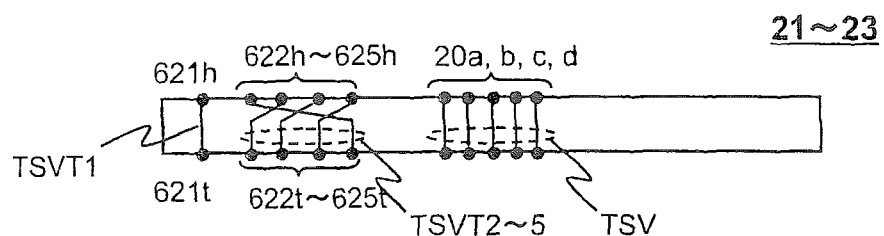
Figure 9C:
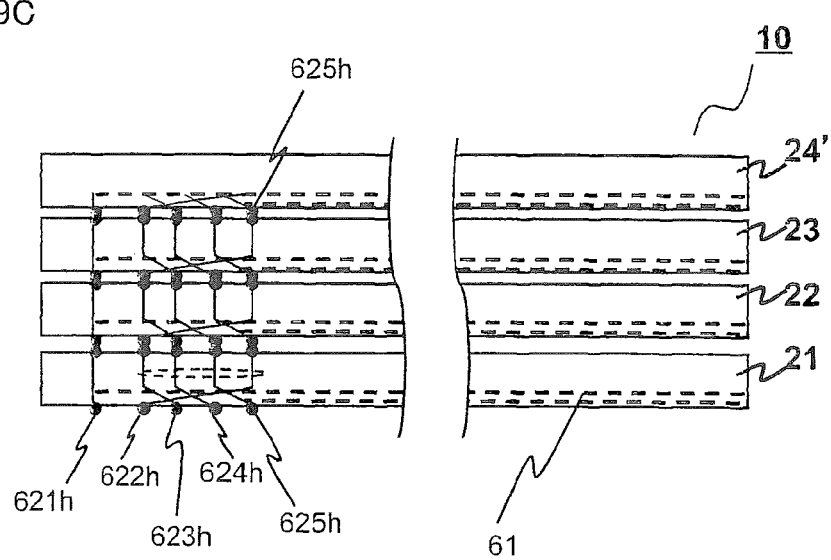

FIGS. 9A-9C illustrates Example 3. Same elements as FIGS. 3A-3B are indicated by the same numbers, and explanation for them is omitted. In this Example, a top chip 24' does not have a through-silicon via, which is different from other semiconductor chips 21-23. It is unnecessary to provide through-silicon vias in the top chip 24' because the semiconductor chips 21-23 and 24' are stacked so that a surface on which a circuit 15 is formed in a downward-facing manner. A step of forming through-silicon vias is merely omitted, and memory circuit, test terminal, signal terminal, multi-layered conductive line connecting each through-silicon via with the corresponding terminal and the like may be formed as same as other semiconductor chips 21-23. The crack check for the top chip 24', including that for other semiconductor chips 21-23, may be performed in a same way as in the example of FIGS. 3A-3B.

Figure 10:
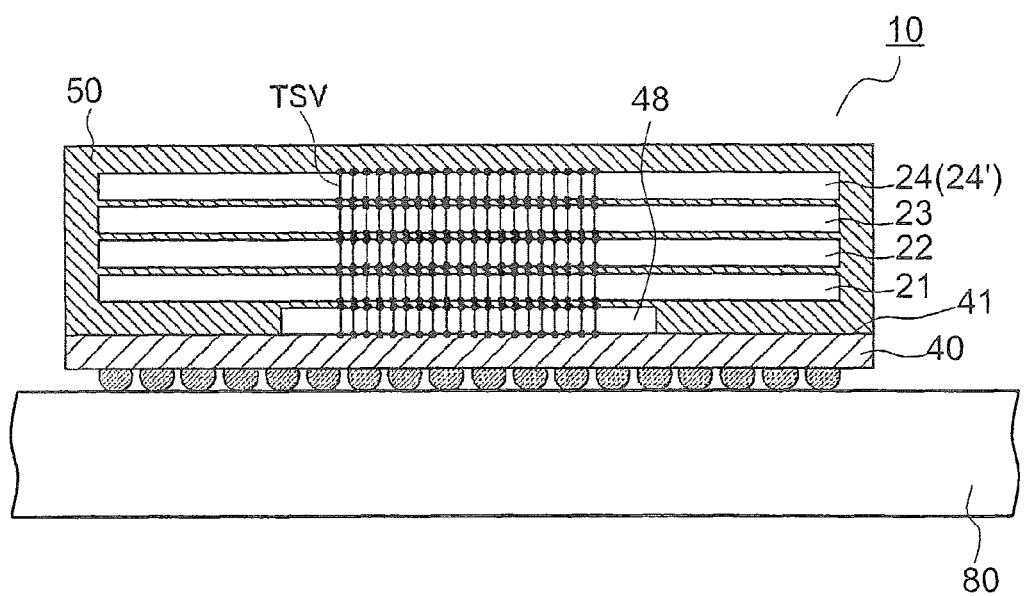
FIG. 10 is a cross-sectional view illustrating an example of mounting each device of Examples on a printed board.

FIG. 10 illustrates an example of mounting a semiconductor chip stack 10 according to Examples 1-3. For simplification, the front side and back side test terminals for the crack check, conductive line, and through-silicon vias for the test are omitted. In this example, each chip in the semiconductor chip stack 10 is formed as a general-purpose memory (e.g., DRAM), and the stack 10 are mounted on a memory controller 48 of controlling each general-purpose memory. The clock terminal, command terminal, address terminal and data terminal of each memory 21-24 (24') are connected in common, and connected to a corresponding terminal of the memory controller 48, respectively. The memory controller 48 is mounted on a package substrate 40, and a multi-chip module is made by sealing the whole with a resin 50. This module is mounted on a circuit board 80 that is a mother board, together with other semiconductor chip(s) such as a MPU, CPU and the like and electric component(s). The package substrate 40 may have an insulator and a conductor(s) formed on a surface and/or inside of the insulator, and be also referred to as a circuit board. The package substrate 40 may be similar to the circuit board 80 as the mother board. Each of the package substrate 40 and the circuit board 80 is formed as a wiring board including a plurality of wirings (or interconnection lines). These wirings or interconnection lines may be formed as a multi-level wiring structure.

Figure 11:
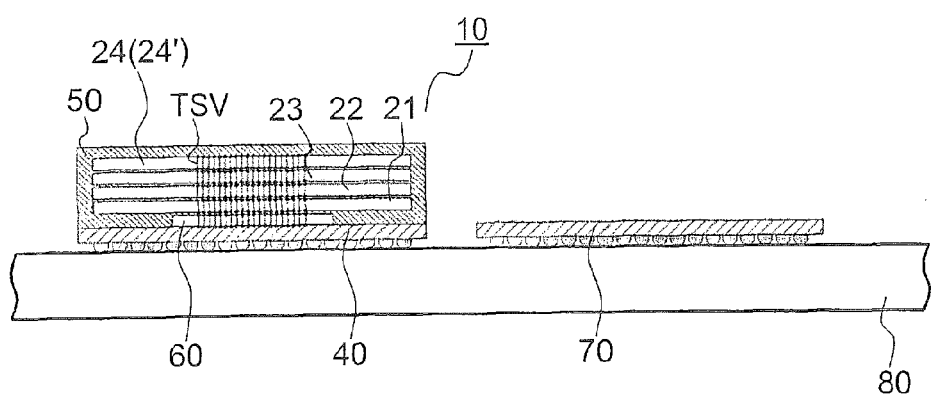
FIG. 11 is a cross-sectional view illustrating another example of mounting each device of Examples on a printed board.
Figure 12A:
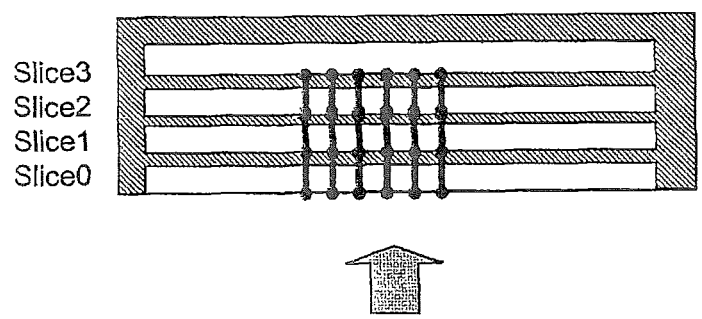
FIGS. 12A-12B are cross-sectional and plan views illustrative of a prototype device.
Figure 12B:
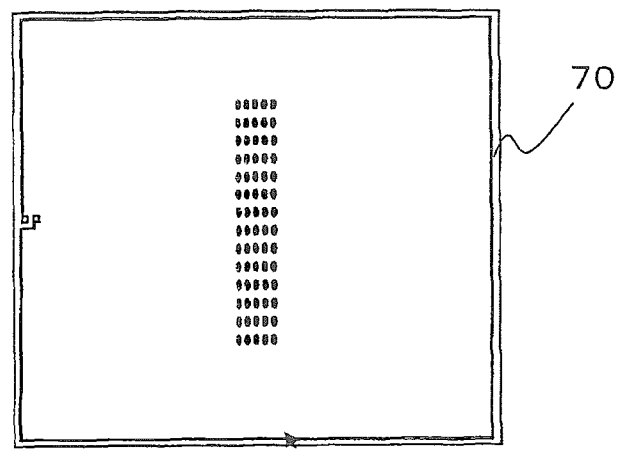

FIG. 11 illustrates other example of mounting a semiconductor chip stack 10 according to Examples 1-3. For simplification, the front side and back side test terminals for the crack check, conductive line, and through-silicon vias for the test are omitted. In this mounting example, each chip of the semiconductor chip stack 10 as a core memory does not have an interface to the memory controller. An interface chip 60 having an interface function operates for the interface. The chip 60 is mounted on the package substrate 40, and the semiconductor chip stack 10 is mounted on the chip 60. On the printed circuit board 80 as a mother board, this module and a memory controller 70 are mounted.

A microprocessor/microcontroller itself such as a MPU and CPU may have a function of the memory controllers 48 and 70. The memory controller 48 and/or interface chip 60 may be mounted on the circuit board 80 without the package substrate 40.

Although the present disclosure has been explained based on the above example, it should be noted that the present disclosure may be changed and modified within the scope of the entire disclosure (including claims and drawings) based on the basic technical idea. Also it should be noted that any combination and/or selection of the disclosed and/or claimed elements (including the figures) may be available within the scope of the claims. That is, it should be noted that the present disclosure may include any modification and/or correction that a skilled person in the art could make according to the entire disclosure including claims and drawings and the technical idea.

What is claimed is:
1. A semiconductor device comprising:
a plurality of signal terminals on each of a plurality of vertically stacked semiconductor chips, each plurality of signal terminals connected to vertically aligned signal terminals of an adjacent semiconductor chip by through silicon vias;

a common test terminal on each of the plurality of vertically stacked semiconductor chips connected to a vertically aligned common test terminal of an adjacent semiconductor chip by a through silicon via;

a plurality of spiral test terminals on the plurality of vertically stacked semiconductor chips, each spiral test terminal connected to a non-vertically aligned spiral test terminal of an adjacent semiconductor chip by a through silicon via; and a conductive line arranged along a periphery of at least one of the plurality of vertically stacked semiconductor chips, the conductive line connected to a respective common test terminal and a respective spiral test terminal.

2. The semiconductor device as claimed in claim 1, wherein the conductive line is arranged along the entire of the periphery.

3. The semiconductor device as claimed in claim 1, wherein the semiconductor chips are identical chips.

4. The semiconductor device as claimed in claim 1, wherein the semiconductor chips are memory chips.

5. The semiconductor device as claimed in claim 1, further comprising a controller chip connected to the signal terminals of a bottom semiconductor chip of the plurality of vertically stacked semiconductor chips.

* * * * *